United States Patent
Bug et al.

[11] Patent Number: 5,835,354
[45] Date of Patent: Nov. 10, 1998

[54] COMPACT MODULAR STRUCTURE FOR ELECTRICAL CONVERTERS

[75] Inventors: Bernhard Bug, Eichenzell; Guenter Fiebig, Gruendau, both of Germany

[73] Assignee: Honeywell Inc., Minneapolis, Minn.

[21] Appl. No.: 591,608

[22] PCT Filed: Sep. 19, 1994

[86] PCT No.: PCT/EP94/03135

§ 371 Date: Mar. 1, 1996

§ 102(e) Date: Mar. 1, 1996

[87] PCT Pub. No.: WO95/08864

PCT Pub. Date: Mar. 30, 1995

[30] Foreign Application Priority Data

Sep. 22, 1993 [DE] Germany ............ 93 14 286 U

[51] Int. Cl.⁶ .................. H01R 9/16; H01R 9/18; H05K 1/14
[52] U.S. Cl. ............ 361/736; 361/775; 361/637; 257/724; 363/144

[58] Field of Search ............... 361/637, 638, 361/728, 752, 775, 736, 803, 804; 257/678, 724; 363/144, 146, 147; 174/68.2, 70 B, 71 B, 72 B, 88 B, 99 B

[56] References Cited

U.S. PATENT DOCUMENTS

| | | | |
|---|---|---|---|
| 4,224,663 | 9/1980 | Maiese et al. | 363/144 |
| 5,383,090 | 1/1995 | Freundner et al. | 174/68.2 |
| 5,579,217 | 11/1996 | Deam et al. | 174/72 B |

FOREIGN PATENT DOCUMENTS 0 373 434 A1  6/1990  European Pat. Off. .......... 361/752

*Primary Examiner*—Leo P. Picard
*Assistant Examiner*—John B. Vigushin

[57] ABSTRACT

A modularly designed converter with T-shaped current bus bars arranged in parallel and with the crossbars thereof mounted on a metal plate but electrically insulated therefrom. The longitudinal ribs of the bus bars support semiconductor valves and the free ends of the bus bars support a power board and a condenser board. The condenser board is spaced from the power board.

8 Claims, 2 Drawing Sheets

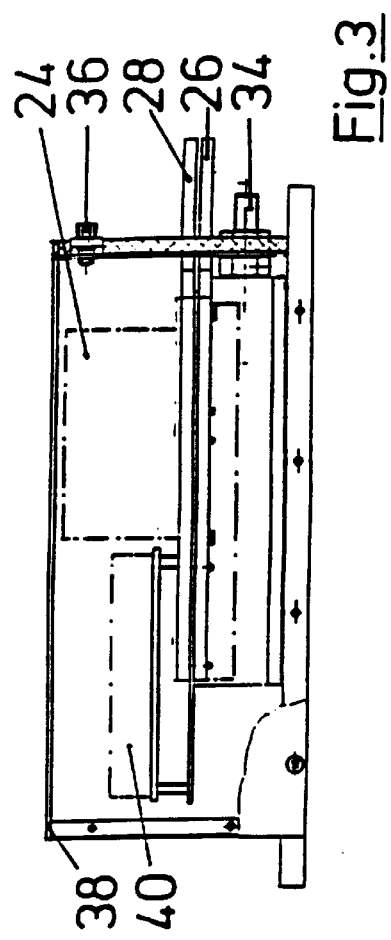
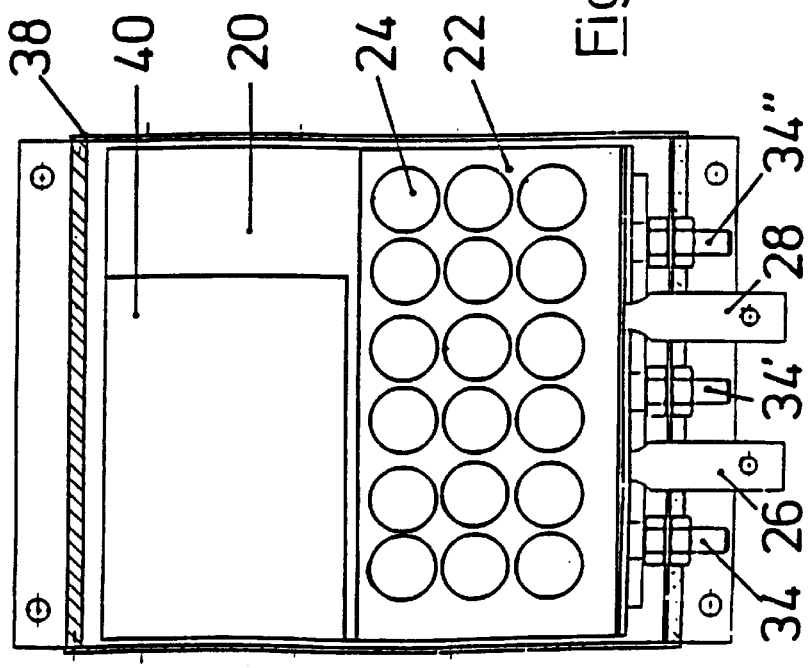

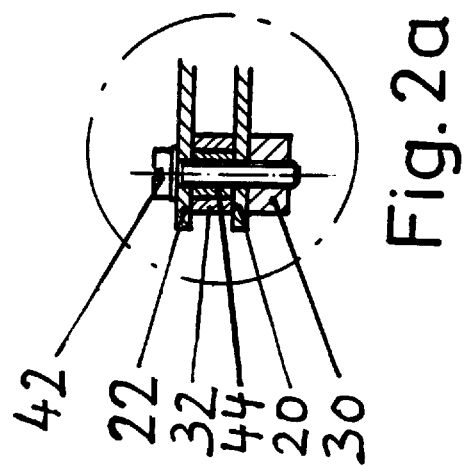
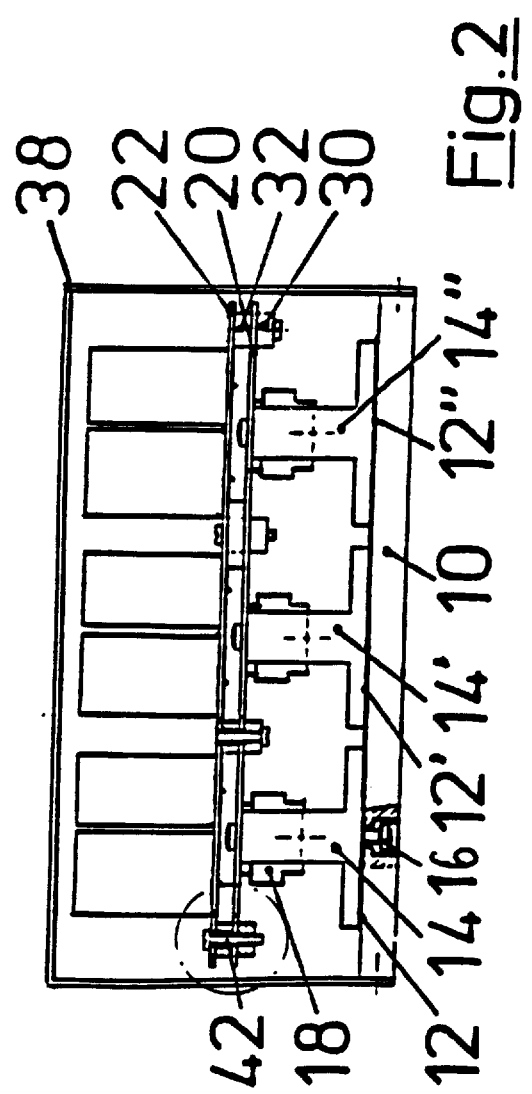

COMPACT MODULAR STRUCTURE FOR ELECTRICAL CONVERTERS

BACKGROUND OF INVENTION

1. Field of the Invention

The present invention is in the field of compact structures for electrical converters and more particularly a compact converter structure having T shaped bus bars with semiconductor valves thereon and supporting a pair of spaced boards which house power circuits, condensers and control electronics.

2. Description of the Related Art

Converters including bus bars, condenser banks, rectifier modules and control circuits are known in the art. For example, German Patent Application DE-OS 40 20 026 assigned to ABB Patent GmbH shows a converter apparatus in which a current bus bar system is used for connecting a condenser bank and rectifier modules so that a modular design results. However, the prior art does not have the modular compactness desired.

SUMMARY OF THE INVENTION

The resent invention provides a very compact modular structure for a converter. This is provided by utilizing T shaped bus bars mounted in parallel with their cross bars on a mounting base plate having an electrical insulating layer thereon. Semiconductor valves are mounted on the sides of the longitudinal ribs of the bus bars and the free ends of the bus bars support a power board and a condenser board in parallel with control electronics connected to the power board.

BRIEF DESCRIPTION OF THE DRAWINGS

FIG. 1 is a plan view of the converter with its hood cut away;

FIG. 2 is a front view of the converter with the front wall being removed;

FIG. 2a is an enlarged detail of an electrical and mechanical connector for the power and condenser boards of the converter; and FIG. 3 is a lateral view of the converter with the lateral wall being cut away.

DETAILED DESCRIPTION OF THE PREFERRED EMBODIMENTS

In the Figures, three T-shaped current bus bars 14, 14' and 14" are shown seated on a solid rectangular metallic base plate 10 with electrical isolating, but relatively well heat conducting layers 12, 12' and 12" being arranged in-between. Fastening of the current bus bars may be done via screws 16. On the longitudinal ribs of the current bus bars 14, 14' and 14" field effect transistors 18 are arranged. On the free ends of the longitudinal ribs of the current bus bars 14, 14' and 14", a power board 20 is supported. Spaced apart from the power board 20, a condenser board 22 is arranged on which the condensers of a condenser bank 24 are seated upright.

A first metallic lug 26 serves to supply the positive voltage, and a second metallic lug 28 serves to supply the negative voltage. A first metallic bar 30 on the lower side of the power board 20 is supplying the positive potential. A second metallic bar 32 arranged between the power board 20 and the condenser board 22 is supplying the negative potential and at the same time keeps both boards 20 and 22 spaced apart. A control electronics 40 is arranged laterally from the condenser bank 24 and is connected to the power board 20.

The device consisting of the power board 20, the condenser board 22 and of both metallic bars 30 and 32 is held together by means of screws 42, where the screws 42 pass through the boards 20 and 22 and by means of an electrically isolating cartridge 44 through the inside bar 32 in order to bring the potential from the external bar 30 to the side of the condenser board 22 which is related to the condenser bank 24.

At the front faces of the current bus bars 14, 14' and 14" connecting terminals 34, 34' and 34" are arranged, at which the converted AC voltage may be tapped. A multipolar plug 36 at the front side of the apparatus serves for a connection to the outside. A metallic hood 38 together with the base late 10 forms a closed housing.

We claim:

1. A modular designed converter which includes a current bus bar system supporting semiconductor valves and a condenser bank connected to the semiconductor valves as well as to a control electronics for the semiconductor valves, comprising:

three T-shaped current bus bars (14, 14' and 14") arranged in parallel with respect to each other and having cross bars, longitudinal ribs and free ends;

a metallic base plate (10) with an electrically isolating layer (12, 12' and 12"), the cross bars being mounted on the metallic base plate with the electrically isolating layer, being arranged in between;

semiconductor valves (18) mounted on the longitudinal ribs;

a power board (20) supported on the free ends;

a condenser board (22) in a distance parallel to the power board (20);

a condenser bank (24) mounted on the condenser board; and, control electronics (40) connected to the power board (20).

2. The converter according to claim 1, wherein the power board (20) extends beyond the condenser board (22) and wherein laterally to the condenser bank (24), the control electronics (40) is arranged on the power board (20).

3. The converter according to claim 2, wherein the condenser bank (24) includes condensers that are arranged upright on the condenser board(22).

4. The converter according to one of claims 1 to 3 wherein the converter converts a DC voltage into a three phase AC voltage and at the front sides of the three T-shaped current bus bars (14, 14' 14") connecting terminals (34, 34' 34") are provided for tapping the AC voltage.

5. The converter according to claim 4, further including two connecting lugs (26,28) for feeding of the DC voltage to the boards (20,22).

6. The converter according to claim 5, further including metal bars (30,32) connected to the connecting lugs (26,28) for supplying the potential, whereat one metal bar (32) is arranged between both boards (20,22) and is spacing both boards.

7. The converter according to claim 6, wherein both metal bars (30,32) are superposed and separated by the power board (20) and the potential of the external metal bar (30) is guided to the outer surface of the condenser board (22) via a screw (42) through both boards (20, 22) and through, but insulated from, the inside metal bar (32).

8. A modular design converter comprising:

a metallic base late;

a plurality of T-shaped current bus bars, each having a cross bar, a longitudinal rib and a free end;

electrically insulating means mounting the cross bars to the metallic base plate;

a plurality of semiconductor valves mounted on the longitudinal ribs;

a power board mounted on the free ends;

a condenser board mounted in spaced relationship to the power board; and, control electronics connected to the power board.

* * * * *